United States Patent [19]

Masuda et al.

[11] 3,855,610

[45] Dec. 17, 1974

[54] SEMICONDUCTOR DEVICE

[75] Inventors: Hiroo Masuda, Kokubunji; Toshiaki Masuhara, Tokorozawa; Minoru Nagata, Kodaira; Tokinori Kozawa, Hachioji, all of Japan

[73] Assignee: Hitachi Ltd., Tokyo, Japan

[22] Filed: June 26, 1972

[21] Appl. No.: 266,043

[30] Foreign Application Priority Data

June 25, 1971 Japan .............................. 46-45669

[52] U.S. Cl. .................................... 357/23, 357/71

[51] Int. Cl. ........................................... H01l 11/14

[58] Field of Search ................. 317/235, 121.1, 5, 3

[56] References Cited

UNITED STATES PATENTS

| | | | |
|---|---|---|---|
| 3,333,168 | 7/1967 | Hofstein | 317/235 |
| 3,339,128 | 8/1967 | Olmstead et al. | 317/235 |
| 3,436,623 | 4/1969 | Beer | 317/235 |
| 3,439,236 | 4/1969 | Blicher | 317/235 |
| 3,450,960 | 6/1969 | Chang et al. | 317/235 |
| 3,455,020 | 7/1969 | Dawson et al. | 29/571 |
| 3,633,078 | 1/1972 | Dill et al. | 317/235 |
| 3,719,866 | 3/1973 | Naber et al. | 317/235 R |

FOREIGN PATENTS OR APPLICATIONS

| | | | |
|---|---|---|---|
| 34,663 | 1970 | Japan | 317/234 |

*Primary Examiner*—Rudolph V. Rolinec
*Assistant Examiner*—E. Wojciechowicz
*Attorney, Agent, or Firm*—Craig & Antonelli

[57] ABSTRACT

The materials or dimensions of a gate insulating film or a gate electrode of an insulated gate field effect type semiconductor device are made different, so as to provide a gate of two or more gate parts having different structures.

It is thus possible to adjust the threshold voltage to a desired value, to render the operation highly speedy, and so forth, and excellent semiconductor devices having hitherto been unattainable can be obtained.

21 Claims, 41 Drawing Figures

SEMICONDUCTOR DEVICE

BACKGROUND OF THE INVENTION

1. Field of the Invention

The present invention relates to an insulated gate field effect type semiconductor device (hereinbelow represented as MOS·FET) formed on a semiconductor substrate. More particularly, a gate is constructed by combining gate parts of different structures, and thus provide a MOS·FET having excellent characteristics which have not been attained with prior-art MOS·FETs.

Further, the present invention provides a gate electrode, in contact with a gate insulating film, of at least two kinds of conductive materials or semiconductor materials having different work functions, to thereby form parts having different threshold voltages within a gate region. Thus, the invention allows the operative speed to be increased, and the drain breakdown voltage to be made high.

2. Description of the Prior Art

The sectional construction and the plan construction of a prior-art N-channel MOS·FET are respectively shown in FIG. 1 and FIG. 2.

Referring to the figures, numeral 1 designates a P-type silicon substrate. Numerals 2 and 3 indicate a source region and a drain region, respectively, which are composed of $N^+$ diffused regions formed in the vicinities of the surface of the substrate 1 by donor diffusion. Shown at 4 is an insulating film consisting of a single layer or multilayer of oxide film, nitride film or the like and formed on the substrate 1. A source electrode 5 and a drain electrode 6 are respectively formed on the source region 2 and the drain region 3 through openings in the insulating film 4. A part of the insulating film 4 between the source region 2 and the drain region 3 is a gate insulating film 4', and a gate electrode 7 is formed thereon. Character L denotes the channel length, while W the channel width.

In order to increase the operating speed of the MOS·FET as described above, generally mutual conductance ($g_m$) may be increased and the stray capacitance decreased. As is well known, $g_m$ in the saturation region in the MOS·FET is expressed by the following equation:

$$g_m = \beta(V_G - V_T) \qquad (1)$$

where $V_G$ indicates the gate voltage, $V_T$ the threshold voltage, and $\beta$ is the coefficient of the transfer conductance, a quantity expressed by the following equation:

$$\beta = \epsilon_{ox}/T_{ox} \cdot W/L \cdot \mu_{eff} \qquad (2)$$

where $\epsilon_{ox}$ represents the dielectric constant of the gate insulating film, $T_{ox}$ the thickness of the gate insulating film, L and W the channel length and the channel width shown in FIG. 2, respectively, and $\mu_{eff}$ the effective carrier mobility.

Accordingly, the methods described below may be used in order to increase $g_m$.

1. $T_{ox}$ is made small, and an insulating material having a large $\epsilon_{ox}$ is used for the gate insulating film.
2. W is made large.
3. L is made small.
4. $V_T$ is adjusted to approach zero volts.

Among the above-mentioned four methods, method (1) increases the stray capacitance between the gate and the substrate, so that its contribution to increasing the speed of the operation of the MOS·FET is small. Method (2) also increases the stray capacitance between the gate and the substrate and the stray capacitance between the drain region and the substrate, so that its contribution of increasing the speed of the operation of the MOS·FET is small. Method (3) is subject to limitations by the following two causes:

I. When L is gradually decreased, the punch through effect becomes significant, with the result that the breakdown voltage of the drain region is lowered.

Herein, the punch-through effect is a phenomenon in which a depletion layer extending from the drain region reaches the source region, and carriers flow between the drain region and the source region through the depletion layer. The state of the depletion layer at this time is shown at 8 in FIG. 3. In the figure, numerals 1 to 7 indicate the same parts as those shown in FIG. 1.

II. Since the precision of the photoetching process at present is, at the highest, $2\mu$ or so, L cannot be made shorter than this.

Between the above two causes, it is (I) that actually controls the channel length L at present.

Now, as to method (4), the value of the threshold voltage $V_T$ can be reduced only to approximately 0.5V due to the cause stated below. The precision of the value of $V_T$ is $\pm$ 0.3V or so at present, and approximately 0.5V is required for the value of $V_T$ in order to provide characteristics of the enhancement type.

Herein, the characteristics of the enchancement type are properties necessary to operate the MOS·FET, especially as a switch for digital use, which is turned off when the input is 0 volts.

For the foregoing reasons, it is difficult to further increase the operating speed of the MOS·FET with the structure of the prior art.

Description will now be made of the stray capacitance. The stray capacitance of a MOS·FET includes the capacitance ($C_{GD}$) between the gate and the drain, the capacitance ($C_{GS}$) between the gate and the substrate, the capacitance ($C_{DS}$) between the drain and the substrate, and so forth. In order to effect high speed operation, it is necessary to make all these capacitances as small as possible. Among the various kinds of stray capacitances, $C_{GD}$ is the capacitance between the input (gate) and the output (drain) and hence, negative feedback is applied to the input side when the MOS·FET conducts during AC operation. The decrease of $C_{GD}$ is, therefore, extremely effective in order to increase operation speed.

On this basis, a four-electrode MOS·FET as shown in FIG. 4 and a MOS·FET of an offset gate as shown in FIG. 5 have been suggested as high speed MOS·FETs.

As apparent from FIG. 4, the four-electrode MOS·FET is constructed such that the gate electrode is divided into a first gate electrode 7' and a second gate electrode 7'', and that an $N^+$-type diffused region 9 is provided in the substrate 1 between the first and second gate electrodes. Signals are applied to the first gate electrode 7', while a bias voltage is normally applied to the second gate electrode 7''.

As illustrated in FIG. 5, the offset gate MOS·FET is constructed such that the overlap between the gate electrode 7 and the drain 3 is removed to provide an offset of *t*. Since the overlap between the gate electrode 7 and the drain 3 is removed by the offset portion, the stray capacitance $C_{GD}$ becomes 0. Thus, harmful negative feedback can be avoided.

The four-electrode MOS·FET, however, is disadvantageous in that, since the number of gates is increased, the area of a chip is enlarged. Moreover, since the bias voltage is applied to the second gate electrode 7'', the wiring becomes complicated.

On the other hand, the MOS·FET of the offset gate cannot form an enhancement type MOS·FET since the gate 7 does not cover the entire area of the channel. Therefore, it cannot be used as a switch for an analog or digital circuit.

In this manner, both the four-electrode MOS·FET and the offset gate MOS·FET have the serious disadvantages. Also, all the previouslymentioned conditions necessary for increasing operating speed cannot be satisfied with only the structures as described above. A MOS·FET exhibiting more excellent characteristics has, therefore, been required.

SUMMARY OF THE INVENTION

An object of the present invention is to solve the above-mentioned problems of the prior-art MOS·FETs, and to provide a MOS·FET enabling high speed operation.

In order to accomplish the above-mentioned object, the present invention provides gate parts of different structures by employing different materials for the gate electrode and the gate insulating film, respectively, and forms a gate by combining the gate parts of the different structures, to thereby form a high speed MOS·FET which exhibits excellent characteristics having been unattainable with prior-art MOS·FETs.

DETAILED DESCRIPTION OF THE INVENTION

The present invention employs different kinds of materials, thicknesses, dimensions, etc. of gate insulating films and gate metals and suitably combines them to thereby form gate parts of different structures, and combines them to constitute a gate. For the sake of convenience in explanation, the case is first referred to wherein the material, dimensions, etc. of the gate insulating films are made different.

As is well known, a MOS·FET may be one of two types--enhancement type and depletion type. The type in which a channel is not formed between the source and the drain for a zero gate voltage is the enhancement type, while the type in which a channel is formed between the source and the drain even when the gate voltages is zero is the depletion type.

The gate section of prior-art MOS·FETs has employed an insulating film of a single structure so that all the MOS·FETs obtained may exhibit characteristics of either the enhancement type or the depletion type.

If, in contrast, the gate section is not composed of such an insulating film of the single structure, but the material, the thickness and the depositing sequence of gate insulating films are varied so that the respective insulating films may serve for the enhancement type, the depletion type and/or a resistance and that they may be suitably combined to constitute one gate section, then it becomes possible to adjust various characteristics of the gate section over a wide range. Thus, a high-speed operation MOS·FET can be expected, which exhibits excellent characteristics having heretofore been unattainable.

The present invention has been developed from such a viewpoint, and has enabled inprovements in characteristics by forming a gate in, e.g., the following combinations:

1. Enhancement type and depletion type.
2. Enhancement type, depletion type and resistance.
3. Enhancement type and resistance.

There will be frst explained a MOS·FET whose gate section is formed in the combination of the enhancement type and the depletion type.

Figure 6:
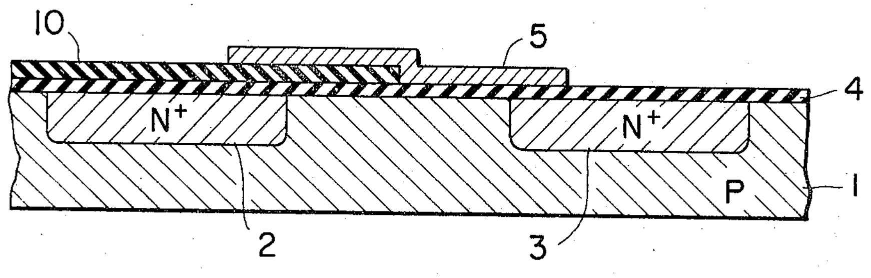
FIGS. 6 to 9 and 12 and FIGS. 15 to 18 are fragmentary sectional views and drain voltage--drain current characteristic curve diagrams showing different embodiments of the present invention, respectively.

FIG. 6 shows a MOS·FET having its gate section formed of two parts, a part at which only an $SiO_2$ layer 4 is used as the gate insulating film and a part at which a double layer including the $SiO_2$ layer 4 and an $Al_2O_3$ layer 10 is used. The part at which the gate insulating film consists only of the $SiO_2$ layer 4 operates as the depletion type, while the part at which it consists of the double layer including the $SiO_2$ layer 4 and the $Al_2O_3$ layer 10 operates as the enhancement type.

The MOS·FET having the above gate structure has a number of advantages as mentioned below.

1. Owing to the effect of the enhancement type part, the device operates as the enhancement type FET, as a whole.

2. As compared with a gate of only the enhancement type of equal channel length, the gate of the invention has its channel conductivity increased by incorporation of the part of the depletion type.

3. By shortening the length of the enhancement type portion of the gate, high speed operation becomes possible.

4. Since the two parts of the enhancement type and the depletion type may exist within one gate, the allowance of mask registration is increased. This is very advantageous during manufacture.

Figure 7:
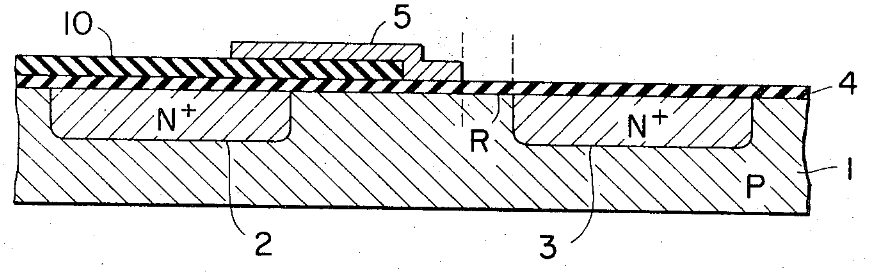

A MOS·FET having a gate comprising in combination the enhancement type, the depletion type and the resistance is constructed as shown in FIG. 7. The portion R in the gate section, at which a gate electrode 5 is not deposited, operates as the resistance.

This type of FET has the advantages as mentioned below.

1. Since the gate electrode 5 and a drain 3 do not overlap, $C_{GD}$ becomes zero.

2. The resistance value of the resistor section is only approximately ⅛ of the value of the equivalent total resistance of the channel section, and exerts little influence on the characteristics. The channel conductivity can be made small in such a way that the resistor section is located on the source side, not on the drain side. Hence, the device can also be used as a load FET of high resistance.

Figure 8:
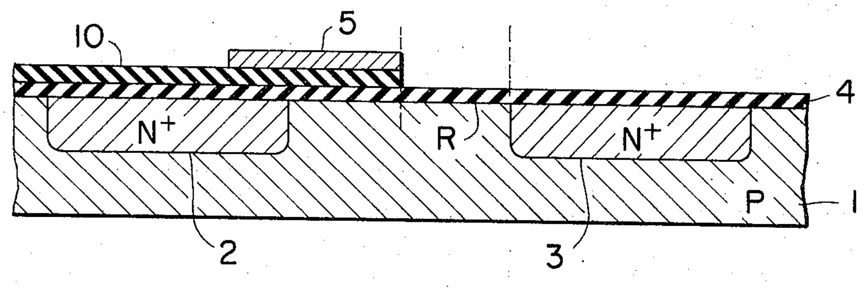

A MOS·FET whose gate section comprises the enhancement type and the resistance is illustrated in FIG. 8. Although the figure shows the case of providing the resistor on the side of a drain 3, it can also be formed on the side of source 2.

This FET has features as set forth below.

1. The prior-art offset gate MOS·FET has been capable of only operating in the depletion mode. In contrast, the whole device of the invention operates as an enhancement type, since the gate is a part of the enhancement type.

2. There is no overlap between the gate and the drain, so that $C_{GD}$ is zero. A high speed operation is, therefore, possible for a digital switch.

3. Although the channel conductivity is lowered due to presence of the resistor, the characteristics are little influenced.

The gate part operative as the enhancement type is formed in such a manner that insulators, such as an $SiO_2$ layer and an $Al_2O_3$ layer, having suitable thicknesses are overlappedly deposited for the gate insulating film. As an example, if an $Al_2O_3$ layer not exceeding about 1,500 A in thickness is deposited on an $SiO_2$ layer being about 500 to about 1,000 A thick, good results can be obtained.

For the gate part of the depletion type, the gate insulating film may be formed only of a dielectric layer which has electric charges of the same conductivity type as that of the semiconductor substrate. Alternatively, the thickness of an insulator layer having electric charges of the same conductivity type as that of the semiconductor substrate may be made larger than the thickness of an insulator layer having electric charges of a conductivity opposite to that of the semiconductor substrate.

For example, only an $SiO_2$ layer having a thickness not exceeding about 1,000 A is used as the gate insulating film. Alternatively, a thinner $Al_2O_3$ layer having a thickness of approximately 1,500 A is deposited on a thicker $SiO_2$ layer having a thickness of at least 3,000 A for use as the insulating film. Then, the operation of the depletion type is secured.

EMBODIMENT 1

Figure 9:
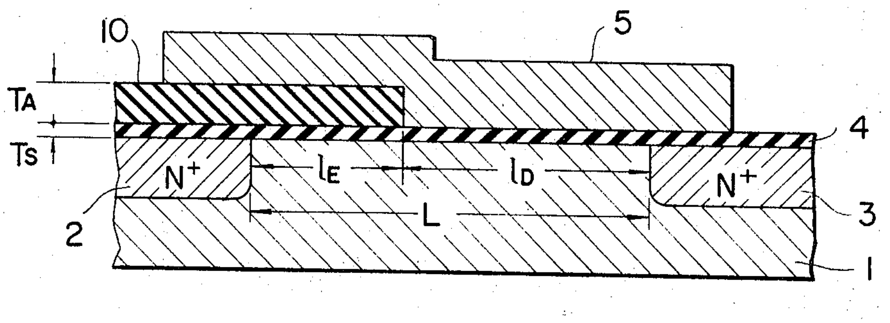

FIG. 9 shows the construction of a MOS·FET in the vicinity of a gate section, which is composed of enhancement type and depletion type parts. The device is formed with the dimensions of various parts in FIG. 9 determined as set forth below. The drain voltage--drain current ($V_D - I_D$) characteristics are measured with a parameter of the gate voleage $V_G$.

| | |
|---|---|
| Channel length L | 8μ |
| Channel length of enhancement type part, $l_E$ | 3μ |
| Channel length of depletion type part, $l_D$ | 5μ |
| Thickness of $SiO_2$ layer 4, $T_S$ | 500 A |
| Thickness of $Al_2O_3$ layer 9, $T_A$ | 1,500 A |
| Gate width W | 10μ |
| Overlapping between gate and drain, $d_D$ | 2μ |
| Overlapping between gate and source, $d_S$ | 2μ |

Figure 10:
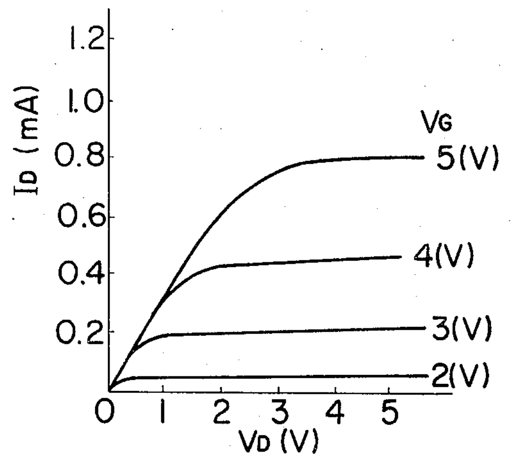
FIG. 10 PRIOR ART
FIGS. 10 and 11 represent drain voltage-drain current characteristics of prior art MOSFETs.
Figure 11:
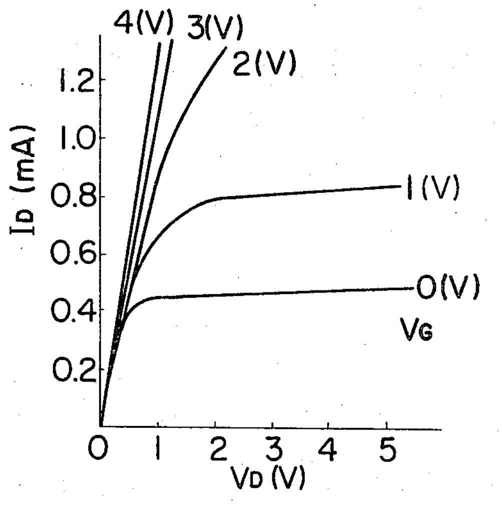
FIG. 11 PRIOR ART
Figure 12:
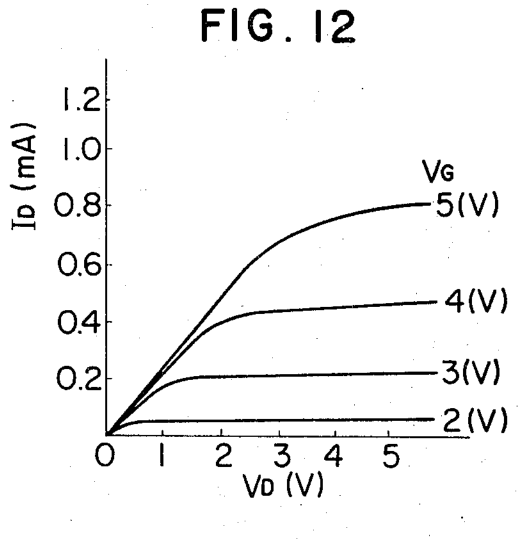

FIG. 10 and FIG. 11 illustrate the $V_D - I_D$ characteristics of MOS·FETs of the enhancement type and the depletion type are formed with the above-mentioned dimensions, respectively, while the $V_D - I_D$ characteristics, in the case of forming the gate of the construction shown in FIG. 9 are illustrated in FIG. 12.

As seen by comparing FIG. 10 and FIG. 12, it is apparent that both characteristics have only slight differences and that the characteristics of the FET according to the present invention as shown in FIG. 9 are determined by the enhancement type part of the gate.

Figure 13:
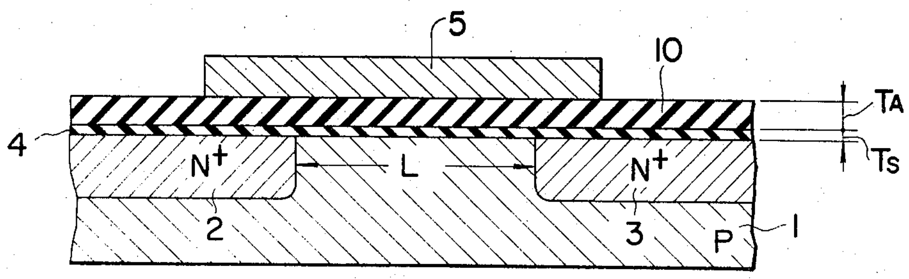
FIG. 13 PRIOR ART

FIG. 13 shows a prior-art MOS·FET of the enhancement type in which the gate insulating film comprises an $SiO_2$ layer 4 and an $Al_2O_3$ layer 10. The $V_D - I_D$ characteristics in the case where the channel length L and the thicknesses $T_S$ and $T_A$ of the $SiO_2$ layer 4 and the $Al_2O_3$ layer 10 are respectively determined as in the above case, are illustrated in FIG. 14.

Figure 14:
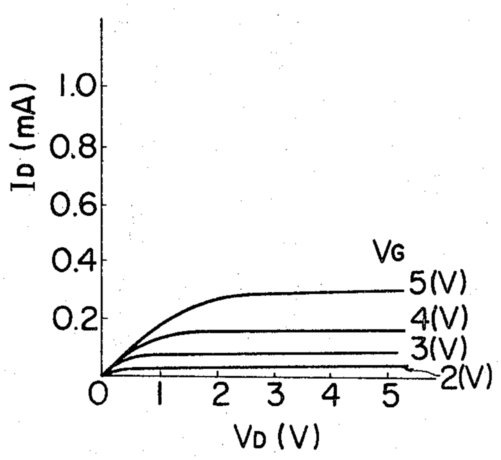
FIG. 14 PRIOR ART
FIGS. 13 and 14 are a fragmentary sectional view and a drain voltage drain current characteristic curve diagram of the prior-art MOS·FET, respectively.

As is apparent by comparing FIG. 14 and FIG. 12, the MOS·FET according to the present invention as shown in FIG. 9 has its channel conductivity improved approximately 2.5 times as compared with the prir-art enhancement type MOS·FET shown in FIG. 13. This means that, if the other conditions are the same, operation at 2.5 times higher speed is possible.

EMBODIMENT 2

Figure 15:
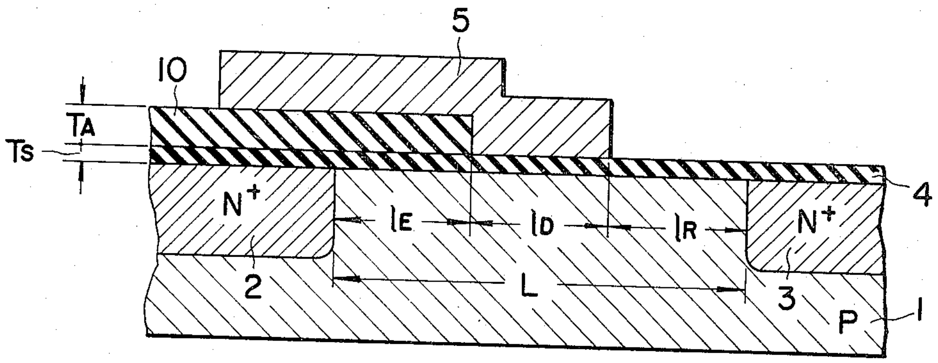

FIG. 15 shows the construction of a MOS·FET in the proximity of a gate section, which is composed of enhancement type, depletion type and resistor parts. The channel length L, the thicknesses $T_S$ and $T_A$ of an $SiO_2$ layer 4 and an $Al_2O_3$ layer 10, respectively, and the gate width W are all made the same as in Embodiment 1.

Figure 16:
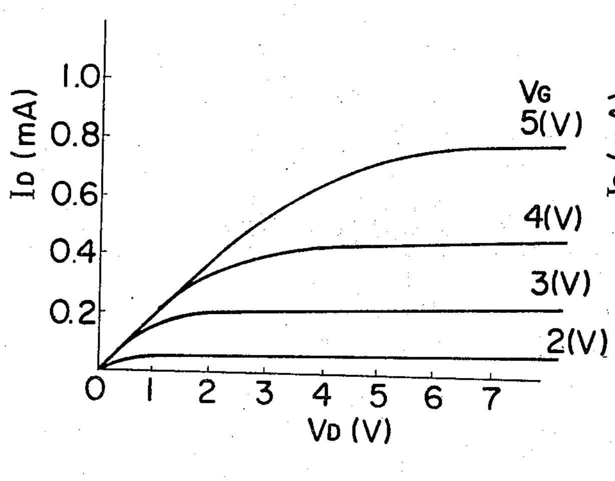

The $V_D - I_D$ characteristics of the MOS·FET of the present invention as shown in FIG. 15 are represented by a graph in FIG. 16, when the following dimensions are selected:

| | | |
|---|---|---|
| Channel length of enhancement type part, | $l_E$ | 3μ |
| Channel length of depletion type part, | $l_D$ | 3μ |
| Channel length of resistor part, | $l_R$ | 2μ |

When the characteristics in FIG. 16 are compared with those shown in FIG. 12 (the characteristics of the FET of the present invention in Embodiment 1), it is understood that the former is slightly lower in gain. The device, however, has the great feature in that $C_{GD}$ is 0.

The value of the total capacitance C is smaller by approximately 20 percent than that of the enhancement type MOS·FET have the prior-art construction shown in FIG. 13, while the value of the channel conductivity ($\beta$) is approximately 2 times larger.

Since the operating speed of FETs is proportional to $\beta/C$, the device enables an operation approximately 2.5 times faster than in the prior-art enhancement type MOS·FET.

EMBODIMENT 3

Figure 17:
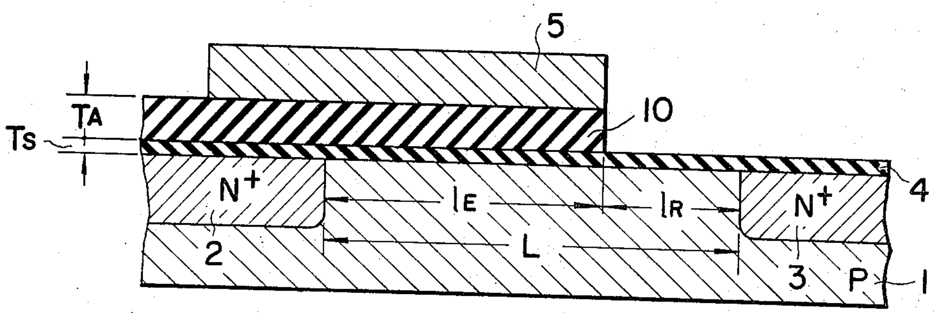

FIG. 17 shows the construction of a MOS·FET in the vicinity of a gate section, which comprises enhancement type and resistor parts. All of the channel length L, the thicknesses $T_S$ and $T_A$ of an $SiO_2$ layer 4 and an $Al_2O_3$ layer 10, respectively, and the gate width W are made equal to those in the cases of Embodiments 1 and 2.

Figure 18:
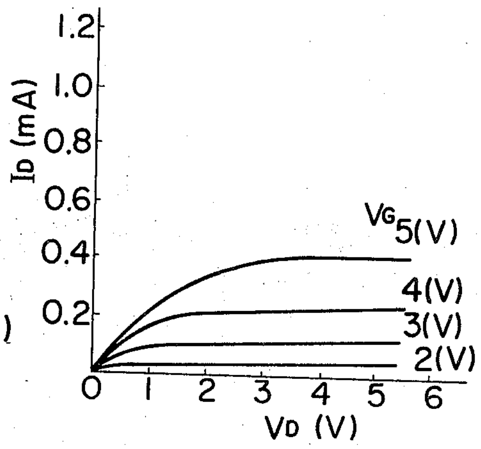

The $V_D - I_D$ characteristics are illustrated by a graph in FIG. 18, wherein the following dimensions are selected:

| | | |
|---|---|---|
| Channel length of enhancement type part, | $l_E$ | 6μ |
| Channel length of resistor part, | $l_R$ | 2μ |

As compared with the values of the enhancement type MOS·FET based on the prior-art construction, $\beta$ becomes approximately 4/3 times larger, while C is reduced by approximately 30 percent. If, therefore, the other conditions are the same, the operational speed becomes approximately 1.9 times higher than in the prior-art MOS·FET.

EMBODIMENT 4

Figure 19:
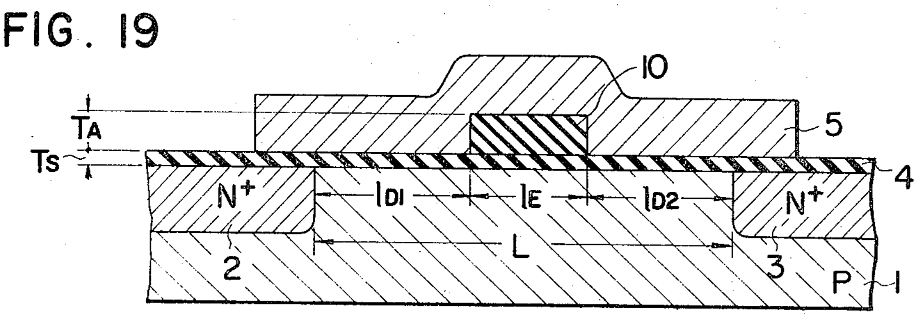
FIG. 19 is a sectional view, partially broken away, for explaining another embodiment of the present invention.

FIG. 19 shows the vicinity of a gate section of a MOS·FET having a construction in which an enhancement type gate part is comprised at the center of depletion type gate parts.

The dimensions are:

| | |
|---|---|
| Channel length of first depletion type part, $l_{D1}$ | 3μ |
| Channel length of second depletion type part, $l_{D2}$ | 3μ |
| Channel length of enhancement type part, $l_E$ | 2μ |
| Thickness of $SiO_2$ layer 4, $T_S$ | 500 A |
| Thickness of $Al_2O_3$ layer 10, $T_A$ | 1,500 A |
| Gate width W | 10μ |

Then, in comparison with the values of the prior-art enhancement type MOS·FET, $\beta$ is approximately 2.5 times larger, and C is substantially equal. The operating speed is, therefore, raised approximately 2.5 times.

In addition, the present invention has numerous advantages as mentioned below.

1. Since the position of the enhancement type part between the source and the drain may be slightly deviated, mask registration during manufacture is easy.

2. Even if the position of the enhancement type part between the source and the drain is slightly varied, the characteristics are not significantly influenced.

3. The source 2 and the drain 3 can be exchanged for each other. The device is, therefore, extremely convenient when used in a circuit.

It has thus far been described that the present invention has such very excellent features such as capability of the higher speed operation than in prior-art MOS·FETs. Further, the present invention has the advantage that, when it is applied to an integrated circuit, a logic circuit with a higher degree of integration than, in the prior art can be assembled.

Description will now be made of an embodiment in which a NAND circuit is arranged using a MOS·FET whose gate section is formed by combining an enhancement type part and a resistor part (the MOS·FET being hereinafter referred to as an E·R gate MOS·FET).

EMBODIMENT 5

Typical fundamental logic circuits in digital circuits are NAND and NOR circuits.

Among the logic gates having $n$ inputs and one output, a logic gate providing a signal at its output only when signals are fed into all its $(1 - n)$ inputs is the NAND gate.

Figure 20:
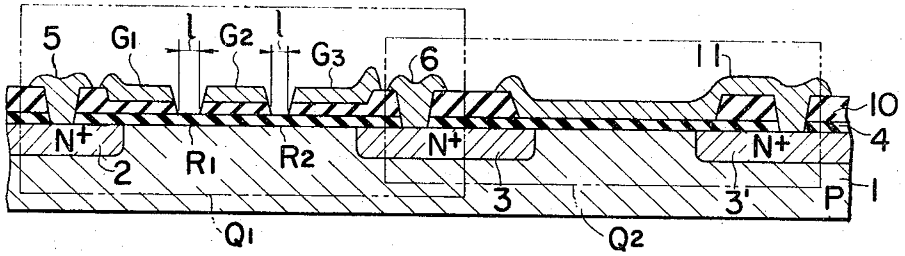
FIGS. 20 and 21 are a fragmentary sectional view in the case where a NAND circuit is arranged in accordance with the present invention, and an equivalent circuit diagram thereof, respectively.
Figure 21:
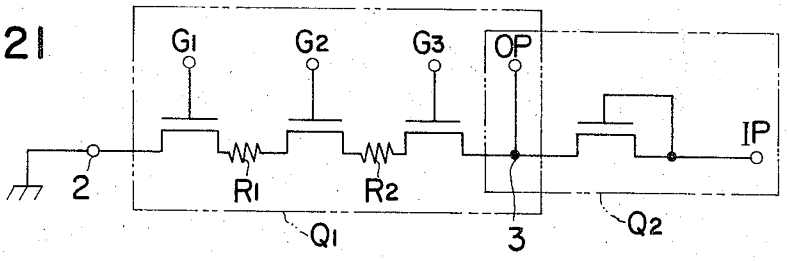

FIG. 20 shows a sectional view of the NAND circuit arranged by the use of an E·R gate MOS·FET, while FIG. 21 illustrates an equivalent circuit thereof. Referring to the figures, $Q_1$ indicates an E·R gate MOS·FET which is provided with a plurality of enhancement type gates $G_1$, $G_2$ and $G_3$, and resistors $R_1$ and $R_2$ each having a length $l$. Another MOS·FET $Q_2$ is used as a load.

Letting $R_{SD}$ be the resistance between a source 2 and a drain 3 in $Q_1$ and letting $R_L$ be the resistance of $Q_2$, an output voltage $V_{out}$ derived from output OP (drain electrode 6 of $Q_1$) is given in such a form that a voltage $V_{imp}$ impressed on input IP (gate electrode 11 of $Q_2$) is divided by $R_L$ and $R_{SD}$.

Accordingly, when at least one of the gates $G_1$, $G_2$ and $G_3$ of the element $Q_1$ is not supplied with a signal, $R_{SD} \approx \infty$ and $V_{out} \approx V_{imp}$ On the other hand, when all the gates $G_1$, $G_2$ and $G_3$ are supplied with signals, $R_{SD} \approx 2K\Omega$ and $R_L = 20 - 30K\Omega$; then, $V_{out} = (R_{SD} \cdot V_{imp}/R_{SD} + R_L) \approx V_{imp}/10$ It is apparent from the above explanation that the NAND circuit can be formed of an E·R gate MOS·FET. The method of forming a NAND circuit using the E·R gate MOS·FET has great advantages as discussed below in comparison with a method in which the prior-art MOS·FET is employed.

1. The degree of integration can be made high.—The gate section comprises a plurality of small gates, and inputs can be impressed on the respective small gates. The degree of integration, therefore, becomes much higher than in the case of using the conventional MOS·FET. If the number of inputs is increased, the effect is more significant.

2. The switching speed is enhanced.—Although, in order to raise the switching speed, it is effective to shorten the gate length, the gate length cannot be made very short on account of the punch through effect. Since, in the E·R gate MOS·FET according to the present invention, there are no diffused layers between the gates $G_1$, $G_2$ and $G_3$, the punch through effect does not readily occur, and the gate length can be made short. The switching speed is, therefore, enhanced.

Embodiments of a method of manufacturing semiconductor devices of the present invention will now be explained.

EMBODIMENT 6

FIGS. 22 a-d illustrate manufacturing steps of a MOS·FET whose gate section comprises an enhancement type part and a depletion type part.

Figure 22A:
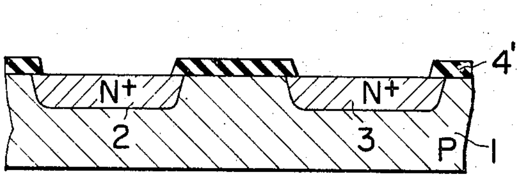
FIGS. 22*a–d* and 23*a–e* are sectional views, partially broken away, showing manufacturing processes of different semiconductor devices according to the present invention, respectively.
Figure 22C:
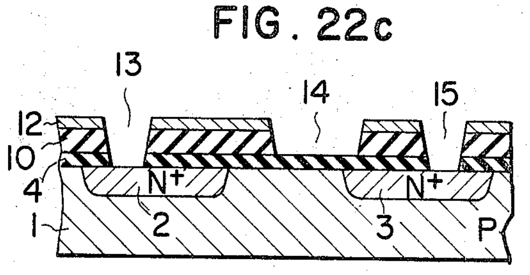

First of all, as shown in FIG. 22*a*, large quantities of N-type impurities are diffused into a P-type silicon substrate 1 by employing an $SiO_2$ layer 4' as a mask, to thereby form a source 2 and a drain 3.

Figure 22B:
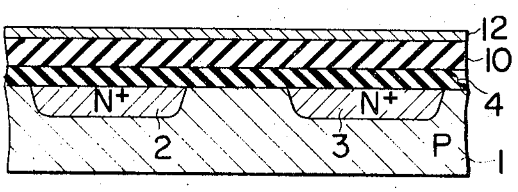

After removing the $SiO_2$ layer 4' used for the mask, an $SiO_2$ layer 4 is deposited over the entire area as shown in FIG. 22*b* by a well-known process such as the thermal oxidation process. Further, an $Al_2O_3$ layer 10 and a Cr layer 12 are successively deposited.

FIG. 22*a* illustrates the step of providing apertures for mounting electrodes. Using photoetching, apertures 13, 14 and 15 are formed at desired parts of the $SiO_2$ layer 4, the $Al_2O_3$ layer 10 and the Cr layer 12. As is apparent from the figure, the openings 13 and 15 for source and drain electrodes reach the Si substrate 1, whereas the opening 14 for a gate electrode does not reach the Si substrate 1, but it penetrates through the $Al_2O_3$ layer 10 as well as the Cr layer 12 to merely reach the surface of the $SiO_2$ layer 4.

Figure 22D:
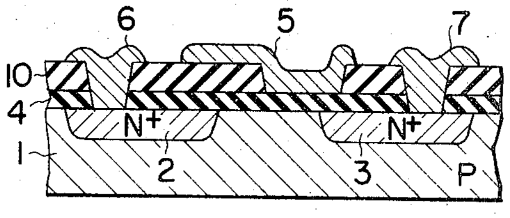

After removing the Cr layer 12 by etching, a layer of a highly conductive metal such as Al is deposited over the entire area, and unnecessary parts are removed by photoetching. Then, as illustrated in FIG. 22*d*, a MOS·FET provided with the gate electrode 5, the source electrode 6 and the drain electrode 7 is formed. The gate section of the MOS·FET comprises, as is apparent from the figure, an enhancement type part at which the gate insulating film consists of the two layers of the $SiO_2$ layer 4 and the $Al_2O_3$ layer 10 and a depletion type part at which it consists only of the $SiO_2$ layer 4. The device has the features previously stated.

EMBODIMENT 7

FIGS. 23 *a–e* illustrate manufacturing steps of a MOS·FET whose gate section comprises an enhancement type part and a resistor part.

Figure 23A:
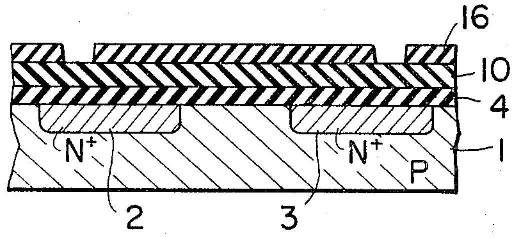

As shown in FIG. 23*a*, large quantities of N-type impurities are diffused into desired positions of a P-type silicon substrate 1, to form a source 2 and a drain 3. Thereafter, an $SiO_2$ layer 4, an $Al_2O_3$ layer 10 and a phosphorus glass layer 16 having desired apertures are deposited in succession by a well-known process such as the thermal oxidation process, CVD and photoetching.

Figure 23B:
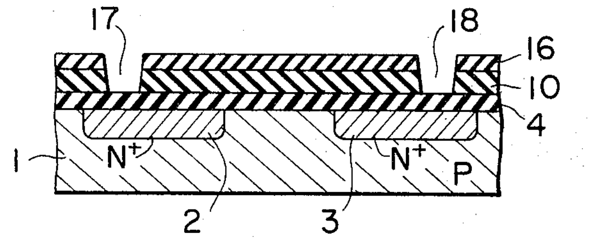

FIG. 23*b* illustrates the step of providing apertures in the $Al_2O_3$ layer 10. The apertures 17 and 18 are formed by employing the phosphorus glass layer 16 as a mask and by the use of an etchant consisting of hot phosphoric acid $H_3PO_4$.

Figure 23C:
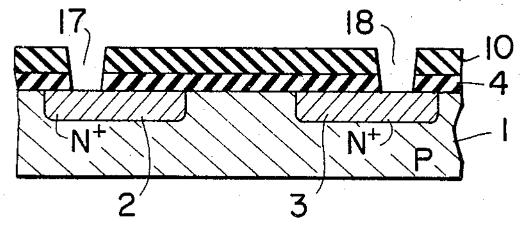

Subsequently, etching is continued using an etchant having a composition in which $NH_4F : HF = 6 : 1$. Then, the $SiO_2$ layer 4 at parts exposed by the apertures 17 and 18 and the phosphorus glass layer 16 are etched and removed. Thus, the semiconductor device becomes as shown in FIGS. 23*c*.

Figure 23D:
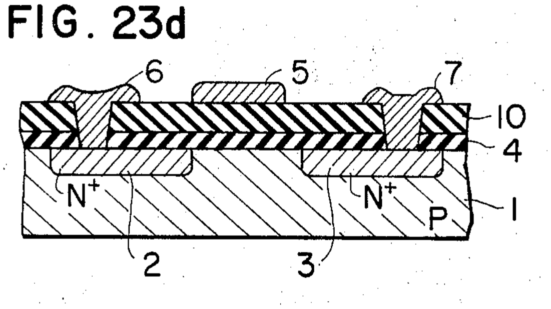

A highly conductive metal such as Al is deposited over the entire area, whereupon unnecessary parts are removed by photoetching. Then, a gate electrode 5, a source electrode 6 and a drain electrode 7 are formed as illustrated in FIG. 23*d*.

Figure 23E:
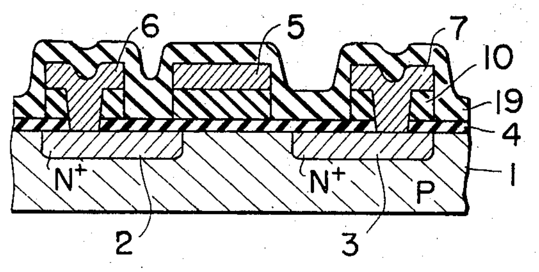

After the $Al_2O_3$ layer 10 at exposed parts is removed by the use of an etchant consisting of hot phosphoric acid ($H_3PO_4$), a phosphorus glass layer 19 is deposited over the entire area. Then, a MOS·FET of a construction shown in FIG. 23*e* is formed.

There have thus far been explained the cases of using gates in which the material or structure of the gate insulating film is partially different.

Description will now be made of cases where gates are constructed by changing the material or dimensions of the gate metal.

These cases eliminate various disadvantages in the prior-art MOS·FETs, in such a way that, using at least two kinds of conductive materials or semiconductive materials different in the work function for the gate electrode held in contact with the gate insulating film, the gate section is constituted of at least two regions having different values of threshold voltages $V_T$. The operating speed of MOS·FETs is thereby increased. Prior to a concrete explanation, description will be made of the threshold voltage $V_T$.

As is well known, the threshold voltage $V_T$ of a MOS·FET is expressed by the following equation:

$$V_T = \phi_{ms} + 2\,|\phi F| - 1/C_{OX}\,(Q_{SS} + Q_B) \qquad (3)$$

where $\phi mS$: the difference in the work function between the material of a gate electrode and that of a semiconductor substrate, $\phi F$: the Fermi potential of the semiconductor substrate, $C_{OX}$: the capacitance of a gate insulating film per unit area, $Q_{SS}$: electric charges existing at the interface between the semiconductor substrate and the gate insulating film, and within the gate insulating film, and $Q_B$: depletion layer charges within the semiconductor substrate.

Among the terms of equation (3), $\phi_{mS}$ is specific to the materials, and does not depend on the manufacturing process. The other factors vary in dependence on the impurity concentration of the semiconductor substrate, the thickness of the gate insulating film, contamination in the manufacturing process, or the like. Thus, when the gate electrode is made of at least two kinds of conductive materials or semiconductor materials, at least two regions differing in the threshold voltage $V_T$ are formed in the gate section. It is greatly advantageous in this case that, since the manufacturing conditions are the same, the difference in the threshold voltage $V_T$ between both the materials is determined at a fixed value with high precision by only the first term of equation (3).

Figure 1:
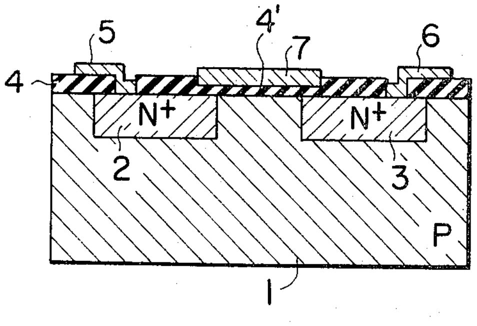
FIG. 1 PRIOR ART
FIGS. 1 and 2 are views showing the sectional construction and the plan construction of a prior-art MOS·FET, respectively.
Figure 3:
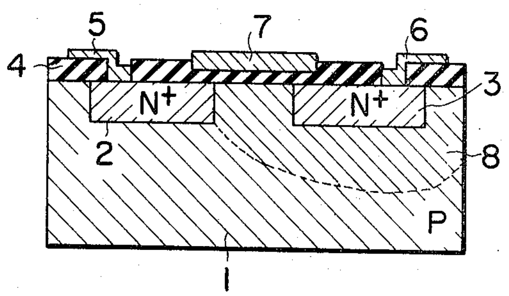
FIG. 3 PRIOR ART
FIG. 3 is a sectional view showing the spread of a depletion layer when the punch through effect occurs in the prior-art MOS·FET.
Figure 2:
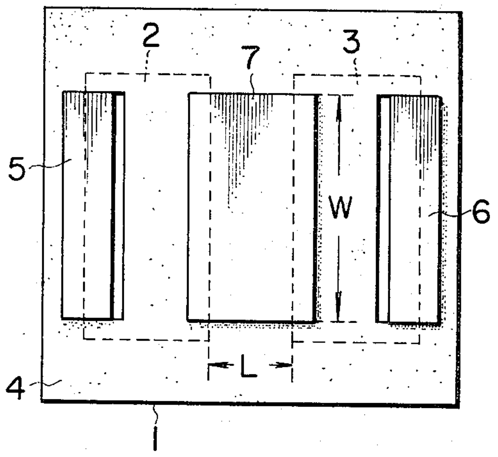
FIG. 2 PRIOR ART
Figure 4:
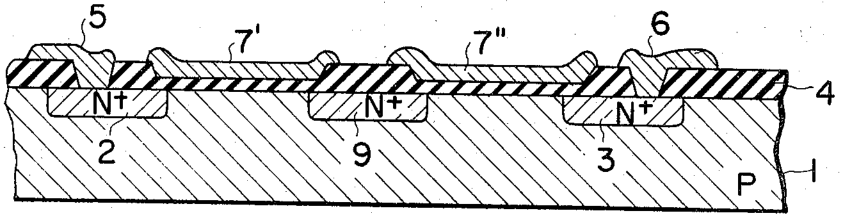
FIG. 4 PRIOR ART
FIGS. 4 and 5 are views showing the sectional constructions of a prior-art MOS·FET having its gate formed in a divided manner, and a prior-art MOS·FET having an offset gate, respectively.
Figure 5:
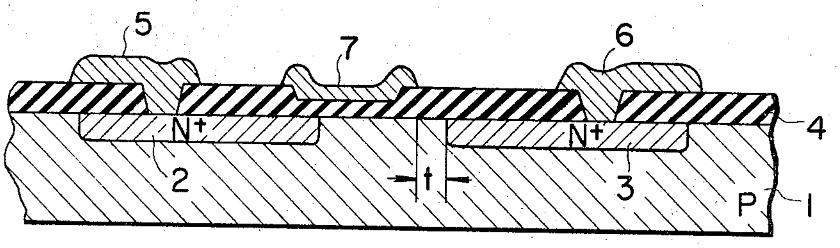
FIG. 5 PRIOR ART
Figure 24:
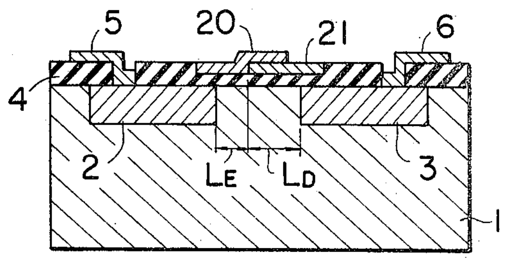
FIGS. 24 to 29 are sectional views and fragmentary plan views showing different embodiments when the gate electrode is constituted of materials of different work functions.

The present invention utilizes this fact. Shown in FIG. 24 is a sectional construction of a semiconductor device of the present invention utilizing this principle. Referring to the figure, numerals 1 to 6 designate the same parts as in FIG. 1, but only the gate electrode differs from that of FIG. 1 and comprises two kinds of electrodes 20 and 21 of different work functions. $L_E$ and $L_D$ are the channel lengths of the parts of the electrodes 20 and 21, respectively. It is required herein to select the materials of the electrodes so that the work function of the electrode 20 may be greater than that of the electrode 21. In addition, the manufacturing process may be determined so that the threshold voltage $V_T$ at the part of the electrode 20 may become, e.g., approximately 0.5V.

The characterizing features of the MOS·FET having the construction illustrated in FIG. 24 as described above are as stated below.

1. Whether the threshold voltage $V_T$ at the part of the electrode 21 has a positive value or a negative value, the characteristics of the enhancement type are exhibited by the effect of the electrode 20. Accordingly, the device can be employed as a switch for analog or digital use.

2. Upon the condition that the geometrical dimensions of the channel length, the channel width and the thickness of the gate insulating film, and the manufacturing process are the same, since the part of the lower threshold voltage $V_T$ is included in the embodiment as compared with the prior-art construction in FIG. 1, this part affords a ready increase in the flow of electric current and an increase in $g_m$.

3. Letting $V_{TD}$ be the threshold voltage at the part of the electrode 21, the punch-through breakdown voltage (hereinafter referred to as $V_{PT}$) at the part of the electrode 20 owing to the channel length $L_E$ when $V_G$ = O (V) may have the values set forth below.

I. $V_{PT} \geqslant O$ (V) at $V_{TD} > O$

II. $V_{PT} > -V_{TD}$ at $V_{TD} \leqslant O$

The drain breakdown voltage at this time is equal to that of an enhancement type MOS·FET having a channel length of $L_E + L_D$.

4. Upon the condition that the geometrical dimensions of the gate section and the manufacturing process are the same, the stray capacitance is quite identical with that of the prior-art construction shown in FIG. 1.

5. When the source and the drain are replaced with each other, the characteristics change. For the combination of materials constituting the electrodes 20 and 21, there can be selected, by way of examples, the following:

I. Al, and Cr, Ni, Mo, Pd, Rh, Pt, Au or P-type silicon.

II. N-type silicon, and Cr, Ni, Mo, Pd, Rh, Pt, Au or P-type silicon.

III. Mo, and Cr, Ni, Rh, Pd, Au, Pt or P-type silicon.

IV. Ti, and Cr, Ni, Rh, Pd, Au, Pt or P-type silicon.

V. Any appropriate combination of the above-mentioned metals.

Furthermore, the gate electrode may be any multilayer structures insofar as the portion held in contact with the insulating film is the same. More specifically, the electrode 20 may be partially placed on the electrode 21 as is the case of FIG. 24 and, in contrast, the electrode 21 may be partially placed on the electrode 20. The materials of the electrodes of the source region and the drain region may be the same as the materials of the gate electrodes 20 and 21, insofar as they are materials capable of establishing the ohmic contact with the source region 2 and the drain region 3. In addition, the electrodes may be in the form of multilayer structures.

While the foregoing embodiment is unidirectional, an embodiment being bidirectional will now be described in conjunction with FIG. 25. Referring to the figure, numerals 1 to 6 indicate the same parts as in FIG. 1, while only the gate electrode varies from those in FIG. 1 and FIG. 24 and comprises two kinds of electrodes 22 and 23 as well as 23' having different work functions. Herein, the channel lengths under the gate electrodes 23, 22 and 23' are respectively represented as $L_1$, $L_2$ and $L_3$ as illustrated. This construction has the following two cases: (I) The work function of the gate electrodes 23 and 23' is larger than that of the gate electrode 22, and (II) the former is smaller than the latter. The characterizing features of the cases of the construction are mentioned below.

The features common to the cases (I) and (II) are:

1. As in the case of FIG. 24, the property of the enhancement type is exhibited by the effect of the enhancement part. The embodiment can accordingly be employed as a switch for analog or digital use.

2. Upon the condition that the geometrical dimensions of the gate section and the manufacturing process are the same, $g_m$ becomes larger as compared with that of the construction in FIG. 1.

3. Although the embodiment has a slightly smaller $g_m$ than the construction of FIG. 24, it is bidirectional.

4. Since that part of the electrode 22 which is held in contact with the gate insulating film 4 may be located between the source region 2 and the drain region 3, allowance of the mask registration is increased.

5. In the case where the threshold voltages $V_T$ at the parts of the two electrodes 23 and 23' are both positive, the drain breakdown voltage is equal to that of an enhancement type MOS·FET having a channel length of $L_1 + L_2 + L_3$. In the case where the threshold voltage $V_T$ at either part is negative and where its value is $V_{TD}$ (V), the punch-through breakdown voltage of the enhancement type part (in the case (I), the enhancement part on the source region side) may amount to $-V_{TD}$ (V).

The drain breakdown voltage at this time differs between the cases (I) and (II), and is as set forth below.

In case (I), it is identical with that of the enhancement type MOS·FET in which the channel length is $L_1 + L_2 + L_3$. In case (II), it is identical with that of an enhancement type MOS·FET in which the channel length is $L_2 + L_3$.

With regard to the combination of the materials of the gate electrode, the kinds of the gate insulating film, the materials of the drain electrode and the source electrode, and so forth, the same conditions as in FIG. 24 apply.

Figure 25:
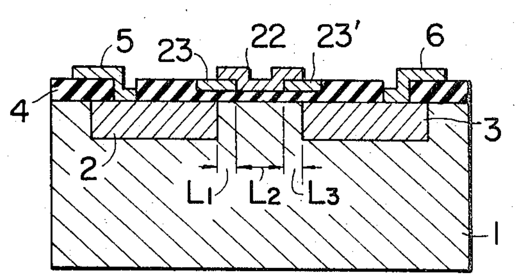
Figure 26:
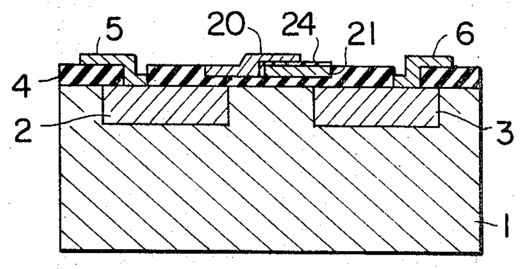
Figure 27:
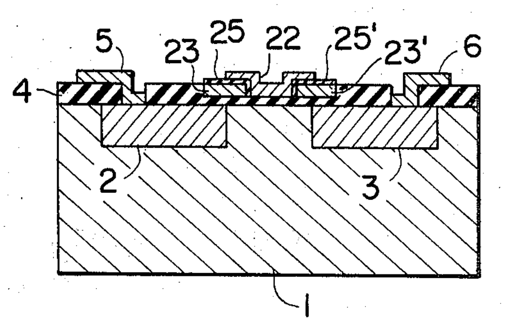

While, in the foregoing two embodiments, two or three gate electrodes are mutually connected electrically and are maintained at the same potential, FIGS. 26 and 27 illustrate cases where the electrodes are mutually insulated electrically. The embodiment in FIG. 26 is constructed such that the two gate electrodes 20 and 21 in FIG. 24 are electrically insulated from each other by an insulating film 24. On the other hand, the embodiment in FIG. 27 is constructed such that the gate electrodes 22, 23 and 23' in FIG. 25 are insulated from one another by insulating films 25 and 25'. The characterizing features of the MOS·FETs having the constructions in FIGS. 26 and 27 are mentioned below.

1. Since the gate electrodes are mutually insulated electrically, a variety of input—output characteristics can be obtained in, e.g., such a manner that a constant voltage is applied to the electrode 21 in FIG. 26, while an input is fed to the electrode 20.

2. For the same reason in connection with item (1), feedback signals can be applied in multifarious ways.

It is also possible to apply independent potentials to two electrodes, if P-type silicon and N-type silicon are used for the electrodes 20, 22 and 21, 23, 23' in FIGS. 24 and 25 and if the potential of the N-type portion is always held higher than that of the P-type portion. Accordingly, the above characteristics can also be obtained with a P-N junction.

Figure 28:
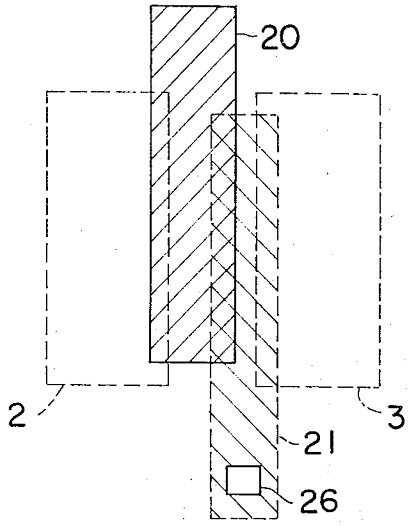
Figure 29:
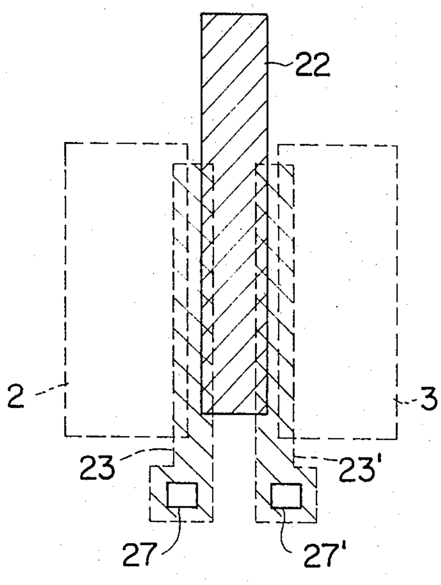

Examples of methods of connecting the mutually insulated electrodes 20, 21 and 22, 23, 23' in the constructions of FIGS. 26 and 27 with the external part are respectively illustrated in FIGS. 28 and 29. Reference numerals in these figures represent the same parts as in FIGS. 26 and 27. Since the insulating films are deposited on the gate electrodes 21 and 23, 23', contact holes 26 and 27, 27' are necessary as illustrated in the figures in order to connect them with the external part.

The manufacturing process of the MOS·FET of the present invention will now be described by taking as an example the device of the construction shown in FIG. 24 and by reference to FIGS. 30 *a–e*.

Figure 30A:
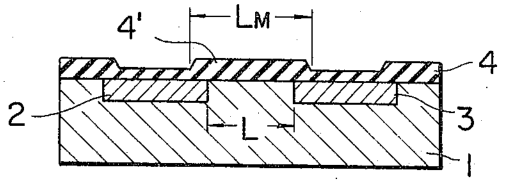
FIGS. 30*a–e* illustrate sectional views showing the manufacturing process of the semiconductor device of the construction in FIG. 24.
Figure 30B:
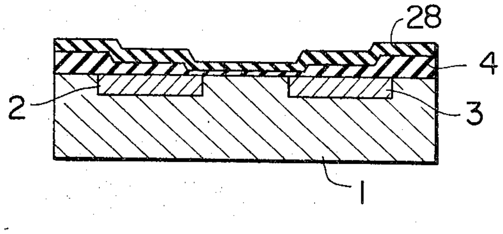
Figure 30C:
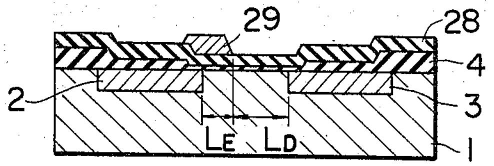
Figure 30D:
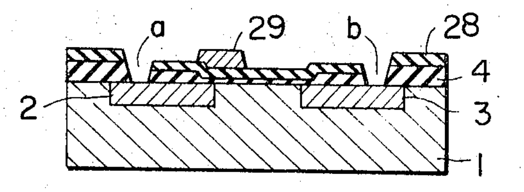
Figure 30E:
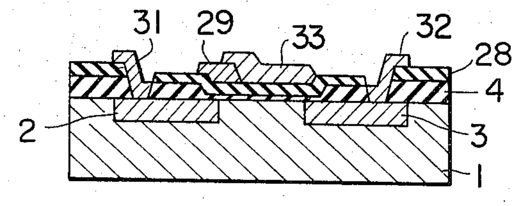

First of all, as illustrated in FIG. 30*a*, large quantities of N-type impurities are diffused into a P-type silicon substrate 1 of a specific resistance of approximately 10 Ω-cm by employing an $SiO_2$ film 4 as a mask, thereby to form a source region 2 and a drain region 3. Subsequently, as shown in FIG. 30*b*, the $SiO_2$ film 4' corresponding to the gate section is removed, an $SiO_2$ film is thereafter formed at the gate section to a thickness of approximately 500 A by a well-known process such as the thermal oxidation process and, further, a phosphorus glass (PSG) film 28 is deposited on the entire area of the $SiO_2$ film to a thickness of approximately 300 A. Then, an Au film is vaporized on the entire area of the phosphorus glass film 28, and it is removed by etching with an Au gate electrode film 29 left on the source region side of the gate section as illustrated in FIG. 30*c*. Thereafter, as shown in FIG. 30*d*, an aperture 30 for mounting a source electrode and an aperture 30' for mounting a drain electrode are provided by etching in the $SiO_2$ film 4 and the phosphorus glass film 28 which are located over the source region 2 and the drain region 3. Lastly, as illustrated in FIG. 30*e*, Al is vaporized on the entire area, and the Al film is removed by etching so as to leave the source electrode 31, the drain electrode 32 and a gate electrode 33. In this case, if $L_M$ is about 6μ and the impurity diffusion is conducted to a depth of approximately 10μ at the step (*a*), L becomes approximately 4μ. At the step (c), in order to increase the drain breakdown voltage at $V_G = O$ (V), the Au gate electrode 29 on the side of the source region 2 is formed by etching the Au film so that $L_E$ may become 2μ. The Si surface is inverted in the conductivity type to the N-type by positive charges existing at the interface between Si and $SiO_2$, and the threshold voltage $V_T$ at the part of the Al gate electrode 33 becomes approximately −0.5 (V) with the above construction of the gate insulating film. On the other hand, the work function of Au is greater by about 1 (V) than that of Al, so that the threshold voltage $V_T$ at the part of the Au gate electrode 29 becomes approximately +0.5 (V). Characteristics attained by the construction as described above, are as stated below.

1. The breakdown voltage of the enhancement type part is approximately 5 (V), and is greater than the absolute value 0.5 (V) of the threshold voltage $V_T$ of the depletion type part. Therefore, the drain breakdown voltage is equivalent to the total channel length, and is approximately 20 (V).

2. In comparison with a MOS·FET of the prior-art construction which has an equal coefficient of transfer conductance, β and a threshold voltage $V_T$ of 0.5 (V), the device of the construction in FIG. 30(*e*) has its mutual conductance $g_m$ improved approximately 1.5 times. If, accordingly, the stray capacitance is equal, the switching speed of the element is improved 1.5 times.

It is apparent from the above detailed explanation that, if the gate electrode is constituted of at least two kinds of conductive materials or semiconductive materials of different work functions in contrast to the prior-art, the mutual conductance $g_m$ and, accordingly, the operative speed are increased. Moreover, since it is unnecessary to make the area larger than in the prior-art device, the device of the present invention is advantageous for use as an integrated circuit element.

What we claim is:

1. A method of manufacturing a metal-oxide-semiconductor field effect transistor comprising the steps of:

forming first and second regions of a first conductivity type a prescribed distance from each other in a major surface of a semiconductor substrate of a second conductivity type opposite said first conductivity type;

forming a first layer of insulating material over the surface of said substrate and said first and second regions;

providing a first electrode layer having a first prescribed work function on a first preselected portion of said first layer of insulating material between said regions; and forming a second electrode layer having a second prescribed work function different from said first prescribed work function on a second preselected portion of said first layer of insulating material between said regions and so as to be contiguous with said first electrode layer.

2. An insulated gate field effect type semiconductor device comprising:

a semiconductor substrate having a major surface;

first and second regions having an opposite conductivty type to that of the substrate disposed in said substrate at said major surface and being separated from each other;

an insulating film having at least one layer, disposed on said major surface of the substrate between said first and second regions;

a first electrode disposed on a part of the insulating film; and a second electrode whose work function is smaller than that of the first electrode, disposed on a part of the insulating film other than the part on which said first electrode is disposed, and being contiguous with said first electrode.

3. An insulated gate field effect type semiconductor device according to claim 2, wherein said first electrode is spaced from each of said first and second regions.

4. An insulated gate field effect type semiconductor device according to claim 3, wherein said second electrode partially overlaps the first electrode.

5. An insulated gate field effect type semiconductor device according to claim 3, wherein said insulating film also extends on parts of the surfaces of said first and second regions, and said second electrode partially extends over both of the first and second regions.

6. An insulated gate field effect type semiconductor device according to claim 2, wherein said second electrode partially overlaps the first electrode.

7. An insulated gate field effect type semiconductor device according to claim 2, wherein said insulating film also extends on parts of the surfaces of said first and second regions, and said first electrode and said second electrode are disposed on said insulating film, so that said first electrode partially overlaps the first region and said second electrode partially overlaps the second region.

8. An insulated gate field effect type semiconductor device according to claim 2, wherein said second electrode consists of Al, and said first electrode consists of a material selected from the group consisting of Cr, Ni, Mo, Pd, Rh, Pt, Au and p-type silicon.

9. An insulated gate field effect type semiconductor device according to claim 8, wherein said first electrode consists of Mo.

10. An insulated gate field effect type semiconductor device according to claim 8, wherein said first electrode consists of Au.

11. An insulated gate field effect type semiconductor device according to claim 8, wherein said first electrode consists of p-type silicon.

12. An insulated gate field effect type semiconductor device according to claim 2, wherein said second electrode consists of n-type silicon, and said first electrode consists of a material selected from the group consisting of Cr, Ni, Mo, Pd, Rh, Pt, Au and p-type silicon.

13. An insulated gate field effect type semiconductor device according to claim 12, wherein said first electrode consists of Mo.

14. An insulated gate field effect type semiconductor device according to claim 12, wherein said first electrode consists of Au.

15. An insulated gate field effect type semiconductor device according to claim 12, wherein said first electrode consists of p-type silicon.

16. An insulated gate field effect type semiconductor device according to claim 2, wherein said second electrode consists of Mo, and said first electrode consists of a material selected from the group consisting of Cr, Ni, Rh, Pd, Au, Pt and p-type silicon.

17. An insulated gate field effect type semiconductor device according to claim 16, wherein said first electrode consists of Au.

18. An insulated gate field effect type semiconductor device according to claim 16, wherein said first electrode consists of p-type silicon.

19. An insulated gate field effect type semiconductor device according to claim 2, wherein said second electrode consists of Ti, and said first electrode consists of a material selected from the group consisting of Cr, Ni, Rh, Pd, Au, Pt and p-type silicon.

20. An insulated gate field effect type semiconductor device according to claim 19, wherein said first electrode consists of Au.

21. An insulated gate field effect type semiconductor device according to claim 19, wherein said first electrode consists of p-type silicon.

* * * * *